(12) United States Patent
Miyoshi et al.

(10) Patent No.: US 8,350,290 B2
(45) Date of Patent: Jan. 8, 2013

(54) LIGHT-RECEIVING DEVICE AND MANUFACTURING METHOD FOR A LIGHT-RECEIVING DEVICE

(75) Inventors: Makoto Miyoshi, Nagoya (JP); Mitsuhiro Tanaka, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 197 days.

(21) Appl. No.: 12/543,706

(22) Filed: Aug. 19, 2009

(65) Prior Publication Data

US 2010/0078679 A1     Apr. 1, 2010

(30) Foreign Application Priority Data

Sep. 30, 2008   (JP) ................................. 2008-252316
Jul. 17, 2009   (JP) ................................. 2009-168485

(51) Int. Cl.
*H01L 31/108*     (2006.01)
*H01L 31/18*      (2006.01)

(52) U.S. Cl. ........ 257/189; 257/184; 257/187; 257/190; 257/191; 257/432; 257/471; 257/E31.065; 438/92; 438/94; 438/575; 438/580; 438/583

(58) Field of Classification Search .................. 257/189, 257/E31.065; 438/94, 575, 580
See application file for complete search history.

(56) References Cited

U.S. PATENT DOCUMENTS

| | | | | |
|---|---|---|---|---|
| 6,104,074 | A * | 8/2000 | Chen | 257/453 |
| 2001/0034116 | A1 * | 10/2001 | Lee et al. | 438/604 |
| 2005/0242366 | A1 * | 11/2005 | Parikh et al. | 257/104 |
| 2008/0087914 | A1 * | 4/2008 | Li et al. | 257/184 |

FOREIGN PATENT DOCUMENTS

JP     2000-101127     4/2000

OTHER PUBLICATIONS

Chang, S.J. et al., GaN Ultraviolet Photodetector with a Low-Temperature AlN Cap Layer, Electrochemical and Solid-State Letters, vol. 10 No. 6, 2007, p. H196-H198.*
Miura, N. et al., Thermal annealing effects of Ni/Au based Schottky contacts on n-GaN and AlGaN/GaN with insertion of a high work function metal, Solid-State Electronics, vol. 48, 2004, p. 689-695.*
Nanjo, Takuma et al., Improvement of DC and RF Characteristics of AlGaN/GaN High Electron Mobility Transistors by Thermally Annealing Ni/Pt/Au Schottky Gate, Japanese Journal of Applied Physics; vol. 43, No. 4B, 2004, pg. 1925-1929.*
Imanaga, Syunji et al., Current-Voltage Characteristics of AlN/GaN Heterostructure Metal Insulator Semiconductor Diode; Japanese Journal of Applied Physics, vol. 40, 2001, pp. 1194-1198.*
S. M. Sze, Semiconductor devices, Physics and Technology, 1987, pp. 293-302.
Osinsky et al., Schottky barrier photodetectors based on AlGaN, Applied Physics Letters, vol. 72, No. 6, Feb. 9, 1998, pp. 742-744.

* cited by examiner

Primary Examiner — N Drew Richards
Assistant Examiner — John P Dulka
(74) Attorney, Agent, or Firm — Burr & Brown (57) ABSTRACT

Provided is a light-receiving device which has light-receiving sensitivity superior to that of a conventional Schottky diode type light-receiving device and also has sufficiently-strengthened junction of a Schottky electrode. A first contact layer formed of AlGaN and having conductivity, a light-receiving layer formed of AlGaN, and a second contact layer formed of AlN and having a thickness of 5 nm are epitaxially formed on a predetermined substrate in the stated order, and a second electrode is brought into Schottky junction with the second contact layer, to thereby form MIS junction. Further, after the Schottky junction, heat treatment is performed under a nitrogen gas atmosphere at 600° C. for 30 seconds.

15 Claims, 4 Drawing Sheets

| FORMATION CONDITIONS OF LIGHT-RECEIVING DEVICE | | | PEEL RATE OF SCHOTTKY ELECTRODE | LIGHT-RECEIVING SENSITIVITY | | |
|---|---|---|---|---|---|---|
| CONFIGURATION OF LAMINATED STRUCTURE PORTION | SCHOTTKY METAL | WHETHER OR NOT HEAT TREATMENT HAS BEEN PERFORMED | | CUT-OFF WAVELENGTH | PHOTOCURRENT (WHEN −4 V IS APPLIED) | DARK CURRENT (WHEN −4 V IS APPLIED) |
| OHMIC CONTACT LAYER : n-Al0.3Ga0.7N (Si : 1×10^18/cm^3) LIGHT-RECEIVING LAYER : Al0.3Ga0.7N SCHOTTKY CONTACT LAYER : AlN | Ni/Au | NOT PERFORMED | 48% | 290nm | 275mA/W | 15pA |
| | Pd/Au | | 30% | 290nm | 245mA/W | 11pA |
| | Pt/Au | | 42% | 290nm | 265mA/W | 8pA |
| | Ti/Al | | 65% | 290nm | 274mA/W | 26pA |
| | Au | | 74% | 290nm | 275mA/W | 7pA |
| | Ni/Au | PERFORMED | 0% | 290nm | 285mA/W | 8pA |
| | Pd/Au | | 0% | 290nm | 286mA/W | 9pA |
| | Pt/Au | | 0% | 290nm | 296mA/W | 10pA |
| | Ti/Al | | 0% | 290nm | 278mA/W | 82pA |
| | Au | | 0% | 290nm | 267mA/W | 6pA |
| OHMIC CONTACT LAYER : n-Al0.4Ga0.6N (Si : 1×10^18/cm^3) LIGHT-RECEIVING LAYER : Al0.4Ga0.6N SCHOTTKY CONTACT LAYER : AlN | Ni/Au | NOT PERFORMED | 52% | 272nm | 277mA/W | 7pA |
| | Pd/Au | | 40% | 272nm | 269mA/W | 8pA |
| | Pt/Au | | 36% | 272nm | 272mA/W | 12pA |
| | Ti/Al | | 68% | 272nm | 283mA/W | 23pA |
| | Au | | 64% | 272nm | 282mA/W | 6pA |
| | Ni/Au | PERFORMED | 0% | 272nm | 285mA/W | 9pA |
| | Pd/Au | | 0% | 272nm | 268mA/W | 8pA |
| | Pt/Au | | 0% | 272nm | 284mA/W | 11pA |
| | Ti/Al | | 0% | 272nm | 286mA/W | 85pA |
| | Au | | 0% | 272nm | 278mA/W | 10pA |
| OHMIC CONTACT LAYER : n-Al0.5Ga0.5N (Si : 1×10^18/cm^3) LIGHT-RECEIVING LAYER : Al0.5Ga0.5N SCHOTTKY CONTACT LAYER : AlN | Ni/Au | NOT PERFORMED | 34% | 260nm | 278mA/W | 9pA |
| | Pd/Au | | 52% | 260nm | 281mA/W | 11pA |
| | Pt/Au | | 62% | 260nm | 285mA/W | 6pA |
| | Ti/Al | | 63% | 260nm | 284mA/W | 18pA |
| | Au | | 48% | 260nm | 279mA/W | 8pA |
| | Ni/Au | PERFORMED | 0% | 260nm | 292mA/W | 20pA |
| | Pd/Au | | 0% | 260nm | 267mA/W | 15pA |
| | Pt/Au | | 0% | 260nm | 274mA/W | 15pA |
| | Ti/Al | | 0% | 260nm | 282mA/W | 75pA |
| | Au | | 0% | 260nm | 281mA/W | 12pA |

FIG. 3

| FORMATION CONDITIONS OF LIGHT-RECEIVING DEVICE | | | PEEL RATE OF SCHOTTKY ELECTRODE | LIGHT-RECEIVING SENSITIVITY | | |
|---|---|---|---|---|---|---|
| CONFIGURATION OF LAMINATED STRUCTURE PORTION | SCHOTTKY METAL | WHETHER OR NOT HEAT TREATMENT HAS BEEN PERFORMED | | CUT-OFF WAVELENGTH | PHOTOCURRENT (WHEN −4 V IS APPLIED) | DARK CURRENT (WHEN −4 V IS APPLIED) |
| OHMIC CONTACT LAYER : n-Al0.3Ga0.7N (Si : 1×10¹⁸/cm³) LIGHT-RECEIVING LAYER : Al0.3Ga0.7N | Ni/Au | NOT PERFORMED | 44% | 290nm | 147mA/W | 1.5nA |
| | Pd/Au | | 22% | 290nm | 137mA/W | 2nA |
| | Pt/Au | | 42% | 290nm | 142mA/W | 1.2nA |
| | Ti/Al | | 65% | 290nm | 143mA/W | 8nA |
| | Au | | 70% | 290nm | 146mA/W | 5nA |
| | Ni/Au | PERFORMED | 0% | 290nm | 150mA/W | 1.5mA |
| | Pd/Au | | 0% | 290nm | 156mA/W | 3mA |
| | Pt/Au | | 0% | 290nm | 165mA/W | 2.5mA |
| | Ti/Al | | 0% | 290nm | 149mA/W | 32mA |
| | Au | | 0% | 290nm | 145mA/W | 2.6mA |
| OHMIC CONTACT LAYER : n-Al0.4Ga0.6N (Si : 1×10¹⁸/cm³) LIGHT-RECEIVING LAYER : Al0.4Ga0.6N | Ni/Au | NOT PERFORMED | 28% | 272nm | 150mA/W | 1nA |
| | Pd/Au | | 34% | 272nm | 156mA/W | 1.5nA |
| | Pt/Au | | 30% | 272nm | 145mA/W | 3nA |
| | Ti/Al | | 56% | 272nm | 147mA/W | 15mA |
| | Au | | 44% | 272nm | 146mA/W | 0.1nA |
| | Ni/Au | PERFORMED | 0% | 272nm | 154mA/W | 5mA |
| | Pd/Au | | 0% | 272nm | 150mA/W | 6mA |
| | Pt/Au | | 0% | 272nm | 140mA/W | 3mA |
| | Ti/Al | | 0% | 272nm | 142mA/W | 8nA |
| | Au | | 0% | 272nm | 138mA/W | 1mA |
| OHMIC CONTACT LAYER : n-Al0.5Ga0.5N (Si : 1×10¹⁸/cm³) LIGHT-RECEIVING LAYER : Al0.5Ga0.5N | Ni/Au | NOT PERFORMED | 52% | 260nm | 152mA/W | 1.5nA |
| | Pd/Au | | 28% | 260nm | 156mA/W | 12nA |
| | Pt/Au | | 20% | 260nm | 148mA/W | 10nA |
| | Ti/Al | | 58% | 260nm | 143mA/W | 50nA |
| | Au | | 38% | 260nm | 153mA/W | 6nA |
| | Ni/Au | PERFORMED | 0% | 260nm | 162mA/W | 12mA |
| | Pd/Au | | 0% | 260nm | 146mA/W | 1mA |
| | Pt/Au | | 0% | 260nm | 148mA/W | 8mA |
| | Ti/Al | | 0% | 260nm | 146mA/W | 10mA |
| | Au | | 0% | 260nm | 151mW | 4mA |

FIG. 4

LIGHT-RECEIVING DEVICE AND MANUFACTURING METHOD FOR A LIGHT-RECEIVING DEVICE

BACKGROUND OF THE INVENTION

1. Field of the Invention

The present invention relates to a light-receiving device, and more particularly, to a light-receiving device formed by using a group III nitride semiconductor.

2. Description of the Background Art

Solar-blind (which means that ultraviolet rays from sunlight are not sensed) ultraviolet sensors are used in fire detectors, for consumer use, and are used in various types of industrial furnaces, boilers for detecting accidental fire, internal combustion engines for monitoring combustion, measurement equipment and the like, for industrial use. For example, phototube-type ultraviolet sensors are widely used as the ultraviolet sensors for industrial purpose.

However, it is generally known that the phototube-type ultraviolet sensor is costly per se and its life is short. There is a possibility that an ultraviolet sensor which has a small size and long life may be realized at low cost if, in place of the above-mentioned conventional products, the ultraviolet sensor is formed of a semiconductor light-receiving device which is a solid-state element. As types of general semiconductor light-receiving devices, there are publicly known photo-resistive type (phototube type), Schottky diode type, P(I)N diode type, avalanche diode type and the like (for example, see S. M. Sze (trans. by Yasuo Nannichi, Mitsuo Kawabe and Fumio Hasegawa), "Semiconductor devices—Physics and Technology", pp. 293-302).

Meanwhile, it is widely known that a group III nitride semiconductor has a direct-transition type wide bandgap and is capable of changing the bandgap through control of a mixed crystal composition, and thus can be used as a material for a light-emitting device and a light-receiving device whose light-emitting/receiving wavelength regions range from a visible region to an ultraviolet region. For example, a Schottky diode type group III nitride semiconductor light-receiving device (for example, see A. Osinsky, S. Gangopadhyay, B. W. Lim, M. Z. Anwar, M. A. Khan, D. V. Kuksenkov and H. Temkin, "Schottky barrier photodetectors based on AlGaN", Applied Physics Letters, Vol. 72, No. 6, PP. 742-744) and a PN diode type group III nitride semiconductor light-receiving device (for example, see Japanese Patent Application Laid-Open No. 2000-101127) have been publicly known. In principle, it is possible to form an ultraviolet light-receiving device of each of the above-mentioned types using a group III nitride semiconductor.

In a case where use of the light-receiving device is spread out to an ultraviolet sensor, high light-receiving sensitivity is required as basic performance. That is, large photocurrent (output current when light is received) and small dark current (output current when light is shielded) are required. Specifically, it is desirable that, when incident light intensity is 10 μW, photosensitivity (S/N ratio) have five or more digits and the photocurrent be approximately 1 A/W or more.

Meanwhile, in a process of manufacturing a Schottky diode type semiconductor light-receiving device using a group III nitride semiconductor, a Schottky electrode composed of a metal material having a high work function, such as Pd, Pt and Ni, is formed by deposition on a semiconductor layer, in which heat treatment is not generally performed after the deposition. This is because, if the heat treatment is performed, Schottky characteristics are impaired and thus the dark current is increased in some cases. However, in a state where the metal electrode is merely deposited, electric contact between metal and the semiconductor layer is not sufficiently obtained, and accordingly, the dark current is increased or the metal film peels off in some cases.

SUMMARY OF THE INVENTION

The present invention has been made in view of the above-mentioned problems, and therefore an object thereof is to provide a light-receiving device which has more excellent light-receiving sensitivity than a conventional Schottky diode type light-receiving device and has sufficiently-strengthened junction of a Schottky electrode.

In order to solve the above-mentioned problems, in the present invention, a light-receiving device includes: a first contact layer which is formed of a first group III nitride and serves as a low-resistance layer having an n-type conductivity; a light-receiving layer which is formed of a second group III nitride, has an n-type conductivity and is adjacent to the first contact layer; a second contact layer which is formed of a third group III nitride, has insulating property and is adjacent to the light-receiving layer; a first electrode which is brought into Ohmic junction with the first contact layer; and a second electrode which is brought into Schottky junction with the second contact layer.

Preferably, in the light-receiving device, the Schottky junction between the second electrode and the second contact layer is strengthened by heat treatment under a nitrogen gas atmosphere.

More preferably, the light-receiving device further includes, between the second electrode and the second contact layer, an interface layer formed by the heat treatment.

According to the present invention, the insulating contact layer is provided on the light-receiving layer, and the electrode is formed on the contact layer by Schottky junction, whereby MIS junction is formed. Accordingly, there can be realized a light-receiving device capable of reducing dark current by a larger amount compared with a case where the electrode is formed directly on the light-receiving layer by Schottky junction. That is, the light-receiving device having excellent light-receiving sensitivity can be realized.

Further, the heat treatment is performed under the nitrogen atmosphere after the electrode is formed by Schottky junction, whereby the Schottky junction electrode is strengthened and peeling can be prevented. Accordingly, there can be stably obtained a light-receiving device which has high reliability and excellent light-receiving sensitivity.

In particular, the interface layer is formed by the heat treatment, whereby the Schottky junction electrode is strengthened further, and thus peeling can be prevented.

These and other objects, features, aspects and advantages of the present invention will become more apparent from the following detailed description of the present invention when taken in conjunction with the accompanying drawings.

DETAILED DESCRIPTION OF THE INVENTION

Figure 1:
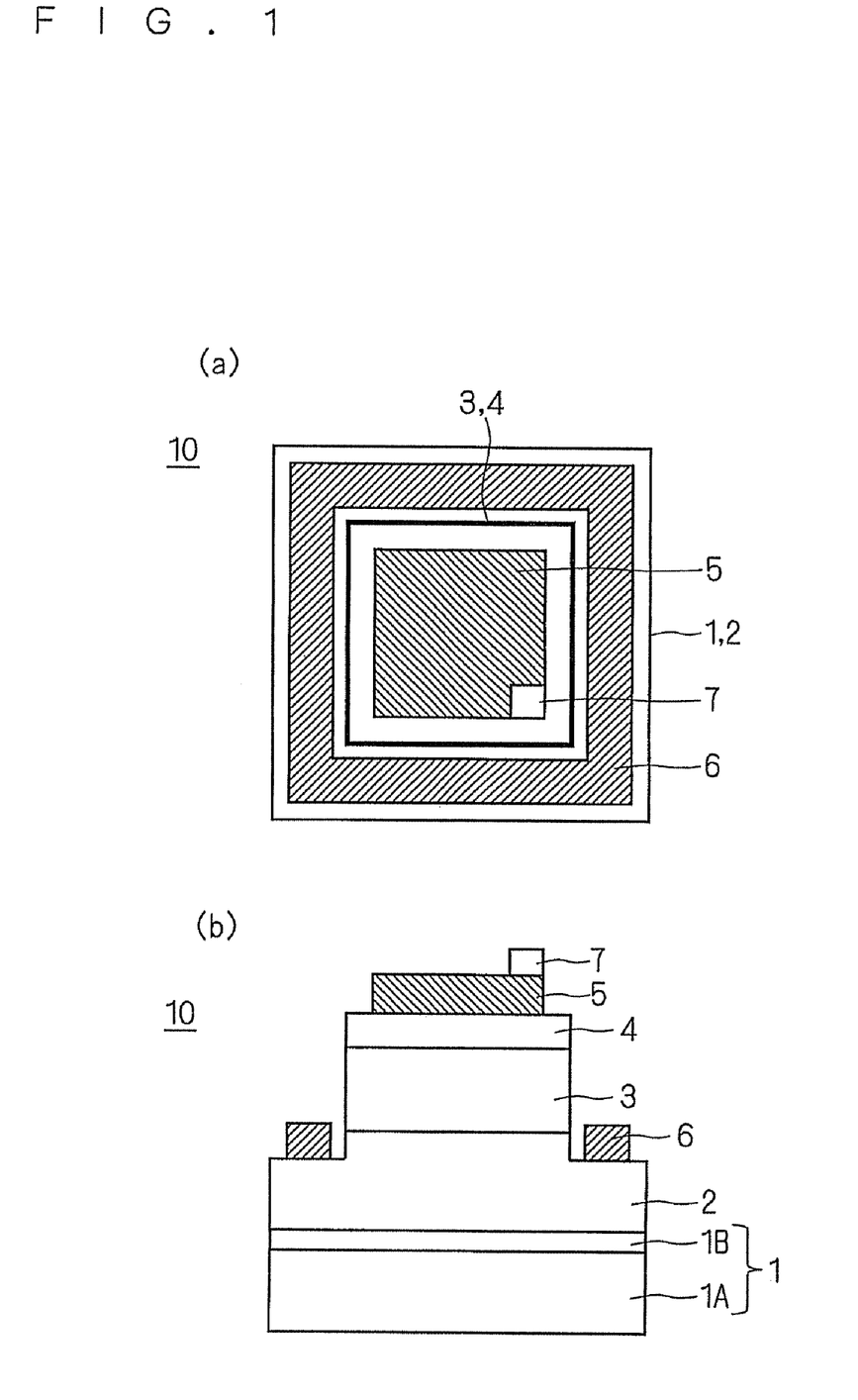
FIGS. 1A and 1B are views showing a configuration of a light-receiving device according to an embodiment of the present invention.

FIGS. 1A and 1B are views showing a configuration of a light-receiving device 10 according to an embodiment of the present invention. FIG. 1A is a top view of the light-receiving device 10, and FIG. 1B is a sectional side view of the light-receiving device 10. Note that real ratios are not reflected in thickness ratios of respective layers in FIGS. 1A and 1B and thereafter.

The light-receiving device 10 includes a laminated structure portion which is formed by epitaxially forming an Ohmic contact layer 2, a light-receiving layer 3 and a Schottky contact layer 4 each of which is composed of a group III nitride semiconductor on a substrate 1 in the stated order. In addition, in the light-receiving device 10, a Schottky electrode 5 is formed on the Schottky contact layer 4 making junction therebetween, and an Ohmic electrode 6 is formed on the Ohmic contact layer 2 making junction therebetween. An electrode pad 7 is formed partially on a top surface of the Schottky electrode 5. These Schottky electrode 5 (more strictly, electrode pad 7) and the Ohmic electrode 6 serve as an extraction electrode for photocurrent in the light-receiving device 10.

As shown in FIG. 1B, the substrate 1 is constituted of a base 1A and a buffer layer 1B which is formed of a group III nitride semiconductor and epitaxially formed thereon. That is, a so-called epitaxial substrate (template substrate) can be used as the substrate 1.

As a preferred example of the base 1A, 6H—SiC single crystal substrate is used. For example, there can be used an n-type conductivity SiC substrate which has a specific resistance of approximately 0.01 Ωcm when doped with N (nitrogen). However, there is no particular limitation on a material of the base 1A as long as a group III nitride semiconductor layer having excellent crystallinity can be formed on a main surface thereof. For example, the material can be appropriately selected among sapphire, Si, GaAs, spinel, MgO, ZnO, ferrite and the like which are typically used in the formation of the group III nitride semiconductor layer, and be used as the base 1A. Further, there is no particular limitation on a thickness of the base 1A. The thickness may be appropriately determined based on requirements such as entire size and the like of the light-receiving device 10, and is preferably several hundreds of μm to several mm for the sake of convenience in handling.

The buffer layer 1B is provided as an underlayer for forming thereon the Ohmic contact layer 2, the light-receiving layer 3 and the Schottky contact layer 4 as group III nitride semiconductor layers having excellent crystal quality. The buffer layer 1B is formed to have a thickness of approximately several tens of nm to several hundreds of nm. As a preferred example, the buffer layer 1B is formed of AlN. In such a case, the buffer layer 1B is formed as a high-resistance layer (insulating layer) having a high specific resistance of $1 \times 10^7$ Ωcm or more.

Note that in manufacturing the light-receiving device 10, the above-mentioned epitaxial substrate may be prepared as the substrate 1, and then the Ohmic contact layer 2, the light-receiving layer 3 and the Schottky contact layer 4 may be successively formed thereon. Alternatively, the buffer layer 1B, the Ohmic contact layer 2, the light-receiving layer 3 and the Schottky contact layer 4 may be successively formed on the base 1A.

The Ohmic contact layer 2 is a conductive layer (low-resistance layer) having n-type conductivity. The Ohmic contact layer 2 is formed by doping donor impurities such as Si into a group III nitride having a composition of $Al_xGa_{1-x}N$ ($0 \leq x \leq 1$) at concentration of $1 \times 10^{17}/cm^3$ to $1 \times 10^{20}/cm^3$. The Ohmic contact layer 2 is formed to have thickness of approximately several hundreds of nm to several μm, and for example, is formed with a thickness of 1 μm as a preferred example. Further, in a case of doping Si, as a preferable example, doping is performed so that a dopant concentration is $1 \times 10^{18}/cm^3$ example. Though resistivity of the Ohmic contact layer 2 differs in accordance with the composition of the group III nitride or the dopant concentration, it is approximately from 0.001 Ωcm to 0.1 Ωm.

Note that the Ohmic contact layer 2 has a convex structure in cross section. A center portion of the Ohmic contact layer 2 when viewed from the top surface thereof forms the above-mentioned laminated structure portion. The Ohmic electrode 6 is brought into Ohmic junction with a side peripheral portion of the Ohmic contact layer 2 also when viewed from the top surface thereof.

As a preferred example, the Ohmic electrode 6 is formed as a multi-layer metal electrode formed of Ti/Al/Ni/Au each having thickness of approximately ten several nm to several tens of nm. The Ohmic electrode 6 can be formed by a photolithography process and a vacuum deposition method.

The light-receiving layer 3 serves as a light-receiving portion (photoelectric conversion portion) in the light-receiving device 10. The light-receiving layer 3 is formed of a group III nitride having a composition of $Al_yGa_{1-y}N$ ($0 \leq y < 1$). A specific resistance (or impurity concentration which affects a value of the specific resistance) and a film thickness of the light-receiving layer 3 can be selected from a range of values with which a depletion layer generated when a reverse bias is applied to the Schottky junction has a sufficient thickness in a depth direction. Such specific resistance (or impurity concentration) can be realized by doping a predetermined dopant as necessary when the light-receiving layer 3 is formed. Alternatively, such specific resistance (or impurity concentration) may be realized with impurities which are inevitably contained when the light-receiving layer 3 is formed without intentionally performing doping as described above. As a preferred example, the light-receiving layer 3 is formed to have a relatively high specific resistance of, for example, 100 Ωcm or more (impurity concentration is $1 \times 10^{15}/cm^3$ or less), and to have thickness of approximately several hundreds of nm to several μm, and for example, 1 μm. In the light-receiving device 10, carriers, which are generated as a result of receiving light in the light-receiving layer 3 which is depleted during the reverse bias, are extracted from the Schottky electrode 5 and the Ohmic electrode 6 which are extraction electrodes so as to amplify reverse current.

In this embodiment, it is assumed that, when the light-receiving layer 3 is formed of AlGaN in this manner, the light-receiving device 10 has a detection wavelength range in an ultraviolet region.

The Schottky contact layer 4 is a layer which is formed to have an extremely thin thickness of approximately several nm and has insulating property. In the light-receiving device 10 according to this embodiment, the Schottky electrode 5 is brought into Schottky junction with the Schottky contact layer 4. That is, the light-receiving device 10 according to this embodiment has a structure in which the Schottky contact layer 4 is interposed between the light-receiving layer 3 and the Schottky electrode 5. In other words, in the light-receiving device 10, so-called metal-insulator-semiconductor (MIS) junction is formed by the Schottky electrode 5, the Schottky contact layer 4 and the light-receiving layer 3. The MIS contact is provided in this manner, and hence in the light-receiving device 10, the dark current is suppressed more in principle compared with a conventional light-receiving device in which a Schottky electrode is directly brought into Schottky junction with a light-receiving layer.

Though a specific value differs in accordance with a composition and a thickness of each part, in the case where the Schottky contact layer 4 is provided on the light-receiving layer 3 and the Schottky electrode 5 is formed thereon as in this embodiment, for example, the dark current when −4 V is applied is suppressed to be approximately 1/1000 of that in the case where the Schottky electrode is formed directly on the light-receiving layer. In addition, the photocurrent increases by roughly 1.8 times to 2 times.

The Schottky contact layer 4 is required to be formed of a material having a bandgap larger than that of the light-receiving layer 3 because of transmitting detected light to the light-receiving layer 3. A specific composition and a thickness thereof may be appropriately determined in a range in which a suppression effect of the dark current due to MIS junction can be sufficiently obtained. However, considering insulating property, Schottky junction characteristic and dielectric characteristic thereof, the Schottky contact layer 4 is preferably formed of a group III nitride having a composition of $Al_zGa_{1-z}N$ ($y<z\leq1$) to have a thickness of approximately several nm. More preferably, the Schottky contact layer 4 is formed of AlN to have a thickness of approximately 5 nm.

As in the case of the Schottky electrode of the conventional light-receiving device, the Schottky electrode 5 is preferably formed of a metal material having a high work function, such as Pd, Pt, Ni and Au, as a formation material. Alternatively, the Schottky electrode 5 may be formed as a multi-layer metal film of each of the above-mentioned metal and Al or the like. In the case where the Schottky contact layer 4 is formed of AlN, in addition to the above-mentioned formation materials, it is possible to use, as the formation material for the Schottky electrode 5, a metal material which would be used in a case where the Ohmic junction is formed with the group III nitride semiconductor, such as a multi-layer metal film containing Ti/Al. This is because, in this case, AlN having a large bandgap and a metal material having a relatively small work function are brought into junction with each other, whereby Schottky contact can be obtained relatively with ease.

However, in the light-receiving device 10, since light which has passed through the Schottky electrode 5 and the Schottky contact layer 4 is received in the light-receiving layer 3, the Schottky electrode 5 is formed so as to have optical transparency for causing light to pass therethrough to an extent that light-receiving sensitivity in the light-receiving layer 3 can be secured. For example, if ultraviolet light is a target to be received and the above-mentioned each metal is used as the formation material, such conditions can be satisfied by forming the Schottky electrode 5 to have thickness of several nm to ten several nm. Alternatively, it is possible to provide optical transparency by forming the Schottky electrode 5 into a lattice shape or a stripe shape.

The Schottky electrode 5 is preferably formed using the photolithography process and the vacuum deposition method. Preferably, in the process of manufacturing the light-receiving device 10, for strengthening junction of the Schottky electrode 5 (preventing the Schottky electrode 5 from peeling off), heat treatment is further performed on a device body (light-receiving device during manufacture) in which the Schottky electrode 5 is formed under the nitrogen atmosphere.

In a case where so-called multi-piece production in which a plurality of light-receiving devices are manufactured from one mother board at the same time is performed, assuming that a rate of the light-receiving devices whose Schottky electrode 5 is peeled off is a peel rate, the peel rate in a case where the heat treatment is not performed, which differs depending on the formation material for the Schottky electrode 5, is 30% at minimum and reaches 70% or more at most. In contrast, in the case where the Schottky electrode 5 is formed of the same formation material and the heat treatment is performed, the peel rate is almost 0%. This is because, when the electrode metal material diffuses into the Schottky contact layer 4 by heat treatment and makes a solid solution therewith, and an interface layer resultantly formed between the Schottky contact layer 4 and the Schottky electrode 5 is contributory to improvement in adhesion of a junction interface. Meanwhile, even in the case where the heat treatment is performed in this manner, the dark current is being suppressed to the same extent as in the case where the heat treatment is not performed. This reveals that as a result of the heat treatment, the Schottky electrode can be brought into Schottky junction with the Schottky contact layer with sufficient junction strength, and that a light-receiving device whose dark current is sufficiently small can be obtained at a high yield rate.

The electrode pad 7 provided for performing die bonding or wire bonding is formed on the Schottky electrode 5. The electrode pad 7 is formed in a minimum size because of the need to secure a light-receiving area in the light-receiving layer 3. As a preferred example, the electrode pad 7 is formed as a multi-layer metal film formed of Ni/Au such that each thereof has thickness of approximately several nm to several tens of nm.

As described above, according to this embodiment, the insulating contact layer is provided on the light-receiving layer, and the electrode is formed on the contact layer by Schottky junction, whereby MIS junction is formed. Accordingly, there can be realized a light-receiving device capable of reducing the dark current by a larger amount and obtaining larger photocurrent compared with the case where the electrode is formed directly on the light-receiving layer by Schottky junction. That is, there can be realized a light-receiving device excellent in light-receiving sensitivity. Moreover, the Schottky electrode is prevented from peeling off when the heat treatment is performed under the nitrogen atmosphere after the formation of the Schottky electrode, with the result that a light-receiving device excellent in light-receiving sensitivity can be stably obtained.

Manufacturing Method for Light-Receiving Device

Next, a manufacturing method for a light-receiving device having the above-mentioned structure is described. The following description is given of a case where the buffer layer 1B, the Ohmic contact layer 2, the light-receiving layer 3 and the Schottky contact layer 4 are successively formed, that is, a laminated structure portion is formed, using a MOCVD method. There may be employed other epitaxial growth technique, and for example, a technique appropriately selected among various vapor phase growth methods and liquid phase growth methods, such as MBE, HVPE and LPE, as long as the technique is capable of forming respective layers so as to provide excellent crystallinity thereto. Alternatively, different growth techniques may be employed in combination.

Note that the following description is given of a case where a plurality of light-receiving devices 10 are manufactured from one base 1A at the same time (case of multi-piece production).

The laminated structure portion can be formed using a publicly-known MOCVD reactor. Specifically, there is used an MOCVD reactor which is configured such that a reactor is capable of being supplied with metal organic (MO) source gas (TMA, TMG) for Al and Ga, silane ($SiH_4$) gas which is a dopant source for Si dope, ammonia gas, hydrogen gas and nitrogen gas.

First, for example, an n-type conductive 6H—SiC substrate which has (0001) plane orientation and a diameter of two inches is prepared as the base 1A, and the base 1A is placed on a susceptor provided in the reactor of the MOCVD reactor. An inside of the reactor is replaced with vacuum gas, and then, an atmosphere in hydrogen/nitrogen mixed flow state is formed while maintaining a pressure inside the reactor at a predetermined value of 5 kPa to 50 kPa (for example, 30 kPa). After that, a temperature of the substrate is raised through susceptor heating.

When a susceptor temperature reaches a buffer layer forming temperature (predetermined temperature of 950° C. to 1,250° C. (for example, 1,100° C.)), Al source gas and $NH_3$ gas are introduced into the reactor, to thereby form an AlN layer serving as the buffer layer 1B.

When the AlN layer is formed, the susceptor temperature is maintained at a light-receiving layer forming temperature (predetermined temperature of 950° C. to 1,250° C. (for example, 1,100° C.)), and TMA, TMG, silane gas and ammonia gas are introduced into the reactor, to thereby start the formation of an $Al_xGa_{1-x}N$ layer serving as the Ohmic contact layer 2. Only the introduction of silane gas is stopped at a point when a predetermined thickness is obtained, and an $Al_yGa_{1-y}N$ layer serving as the light-receiving layer 3 is subsequently formed. The introduction of TMG is stopped at the point when the $Al_yGa_{1-y}N$ layer having a predetermined thickness is formed, whereby the Schottky contact layer 4 is formed to have a predetermined thickness.

The laminated structure portion is obtained in the procedure described above, and then is used to manufacture the light-receiving device 10. Note that the respective steps thereafter are realized by a publicly-known technique.

First, a perimeter part of the laminated structure portion is removed by etching using the photolithography process and a reactive ion etching (RIE) method so that the Ohmic contact layer 2 is exposed.

Next, the photolithography process and the vacuum deposition method are used to form a metal pattern of Ti/Al/Ni/Au which serves as the Ohmic electrode 6 in the exposed part of the Ohmic contact layer 2. Then, in order to improve Ohmic characteristics of the Ohmic electrode 6, heat treatment is performed on the obtained device body for several tens of seconds under the nitrogen gas atmosphere at a predetermined temperature of 650° C. to 1,000° C.

Then, the photolithography process and the vacuum deposition method are used to form a metal pattern of a predetermined formation material for Schottky electrode which serves as the Schottky electrode 5 substantially over the entire top surface of the Schottky contact layer 4. In order to improve junction strength of the Schottky electrode 5, the heat treatment is performed on the device body in which the Schottky electrode 5 is formed, for several tens of seconds under the nitrogen gas atmosphere at a predetermined temperature of 500° C. to 900° C.

The Schottky electrode 5 is formed, and then, the electrode pad 7 of Ni/Au is further formed using the photolithography process and the vacuum deposition method.

After that, the device body is cut into chips in a predetermined size by dicing, whereby a plurality of light-receiving devices 10 are obtained. Die bonding or wire bonding is appropriately performed on the obtained light-receiving devices 10.

Inventive Example

Figure 2:
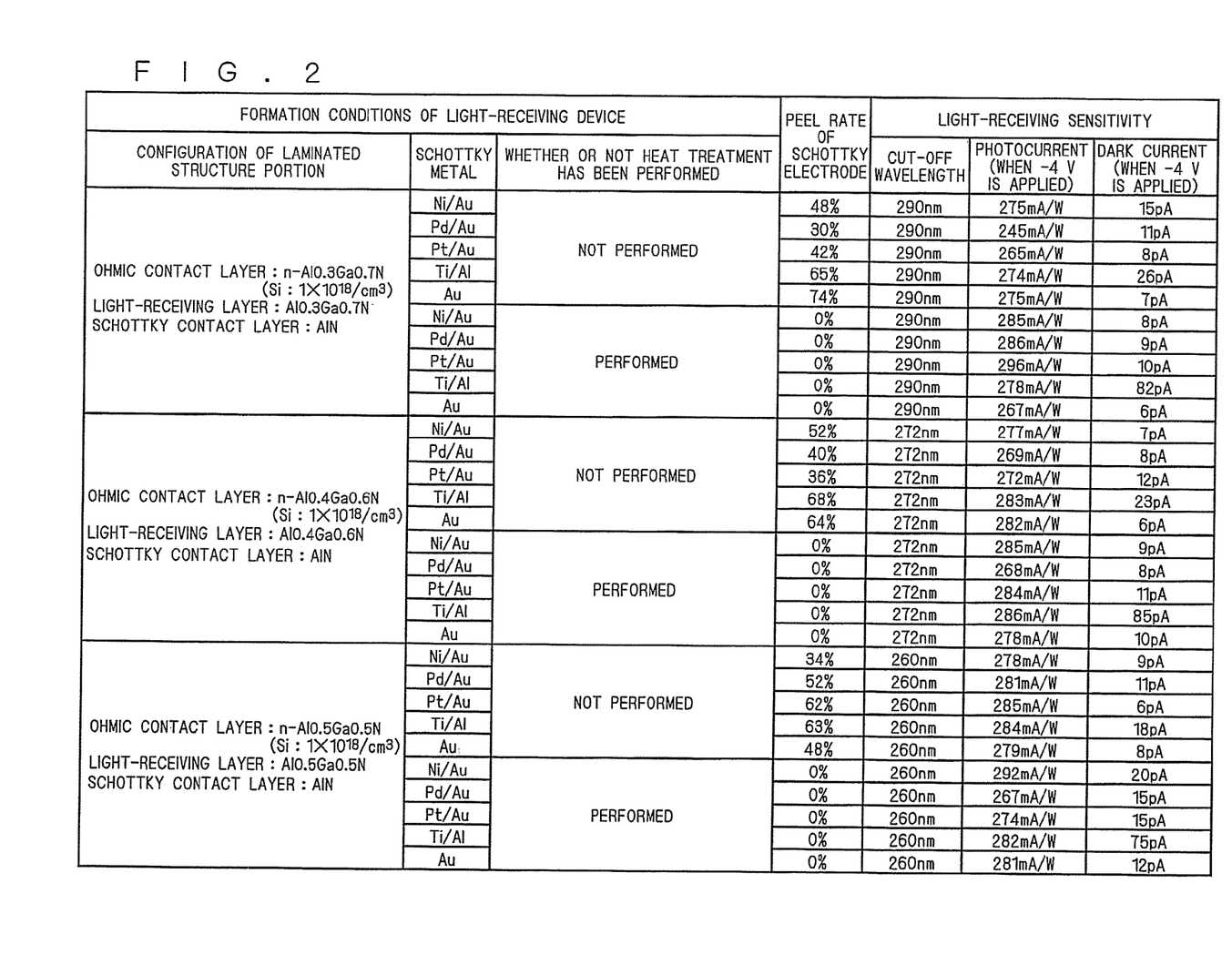
FIG. 2 is a table showing formation conditions and measurement results of light-receiving sensitivity of a light-receiving device according to Inventive Example.

FIG. 2 is a table showing formation conditions and measurement results of light-receiving sensitivity of the light-receiving device according to Example.

In this example, as the light-receiving device 10 according to the embodiment described above, twenty-four types of light-receiving devices were manufactured, which were different from each other in manufacturing conditions, that is, composition of a group III nitride forming the Ohmic contact layer 2 and the light-receiving layer 3, formation manner of the Schottky electrode 5, and whether or not heat treatment has been performed on the Schottky electrode 5. Note that, for each of the respective types, fifty light-receiving devices in which the light-receiving layer 3 was 1 by 1 mm in size when viewed from a top surface thereof were manufactured from one base 1A.

Specifically, the composition of the Ohmic contact layer 2 and the light-receiving layer 3 was set to three levels of $Al_{0.3}Ga_{0.7}N$, $Al_{0.4}Ga_{0.6}N$ and $Al_{0.5}Ga_{0.5}N$.

As the Schottky electrode 5, there were formed five types of multi-layer films in total, that is, four types of multi-layer films of Ni/Au (thickness: 6 nm/12 nm), Pd/Au (6 nm/12 nm), Ti/Al (6 nm/12 nm) and Pt/Au (6 nm/12 um), and a single-layer film (12 nm) formed of only Au. Note that the Ti/Al multi-layer film is generally used as metal for Ohmic junction with a group III nitride material.

For the light-receiving device under each manufacturing condition, an n-type conductive 6H—SiC substrate which has (0001) plane orientation and has a diameter of 2 inches was used as the base 1A. The SiC substrate was doped with N as a dopant. A thickness and a specific resistance thereof were 400 μm and 0.01 Ωcm, respectively.

On the base 1A, the buffer layer 1B, the Ohmic contact layer 2, the light-receiving layer 3 and the Schottky contact layer 4 were formed by the MOCVD method. A formation temperature was 1,100° C.

In any of the light-receiving devices, an AlN layer was formed to have a thickness of 0.5 μm as the buffer layer 1B.

The thicknesses of the Ohmic contact layer 2 and the light-receiving layer 3 were 1 μm and 0.5 μm, respectively. As donor impurities, Si was introduced into the Ohmic contact layer 2 at a concentration of $1\times10^{18}/cm^3$. Resistivities of the Ohmic contact layers 2 were measured after the formation of the Ohmic contact layers 2 performed on similar conditions, with the result that the resistivities of the Ohmic contact layers 2 formed of $Al_{0.3}Ga_{0.7}N$, $Al_{0.4}Ga_{0.6}N$ and $Al_{0.5}Ga_{0.5}N$ were 1 Ωcm, 0.02 Ωcm and 0.03 Ωcm, respectively.

As the Schottky contact layer 4, an AlN layer was formed to have a thickness of 5 nm.

The laminated structure portion was obtained in this manner, and then, a side peripheral potion of the laminated structure portion in top view was etched to a depth of about 600 nm by the photolithography process and the RIE method so that the Ohmic contact layer 2 is exposed to ensure a formation region of the Ohmic electrode 6.

Subsequently, in a location in which the Ohmic electrode 6 is to be formed, a pattern of the Ohmic electrode 6 of Ti/Al/Ni/Au (each thickness thereof was 15/70/12/60 nm) was formed using the photolithography process and the vacuum deposition method. After that, heat treatment was performed in the nitrogen atmosphere at 850° C. for 30 seconds.

Subsequently, on a top surface of the Schottky contact layer 4, the Schottky electrode 5 was formed on the above-mentioned conditions using the photolithography process and the vacuum deposition method. The heat treatment was performed as required in the nitrogen atmosphere at 600° C. for 30 seconds.

Further, the electrode pad 7 of Ni/Au (each thickness thereof was 6/60 nm) was formed in a location on the top surface of the Schottky electrode 5, in which the electrode pad 7 is to be formed.

The electrode pad 7 was formed, and then the device body was cut into chips by dicing, to thereby obtain fifty light-receiving devices 10.

For the obtained light-receiving devices 10, the presence/absence of peeling of the Schottky electrode 5 was evaluated visually and using a microscope, whereby the peel rate was determined as a ratio of the number of light-receiving devices in which peeling of the Schottky electrode 5 was observed to the total fifty light-receiving devices. In addition, the dark current and photocurrent when −4 V was applied were measured after performing die bonding and wire bonding. Further, a cut-off wavelength was obtained by varying an incident wavelength. Accordingly, the results shown in FIG. 2 were obtained. As to the light-receiving sensitivity, FIG. 2 shows average values of the measurement results obtained on the light-receiving devices in which the Schottky electrode 5 did not peel off.

Comparative Example

Figure 3:
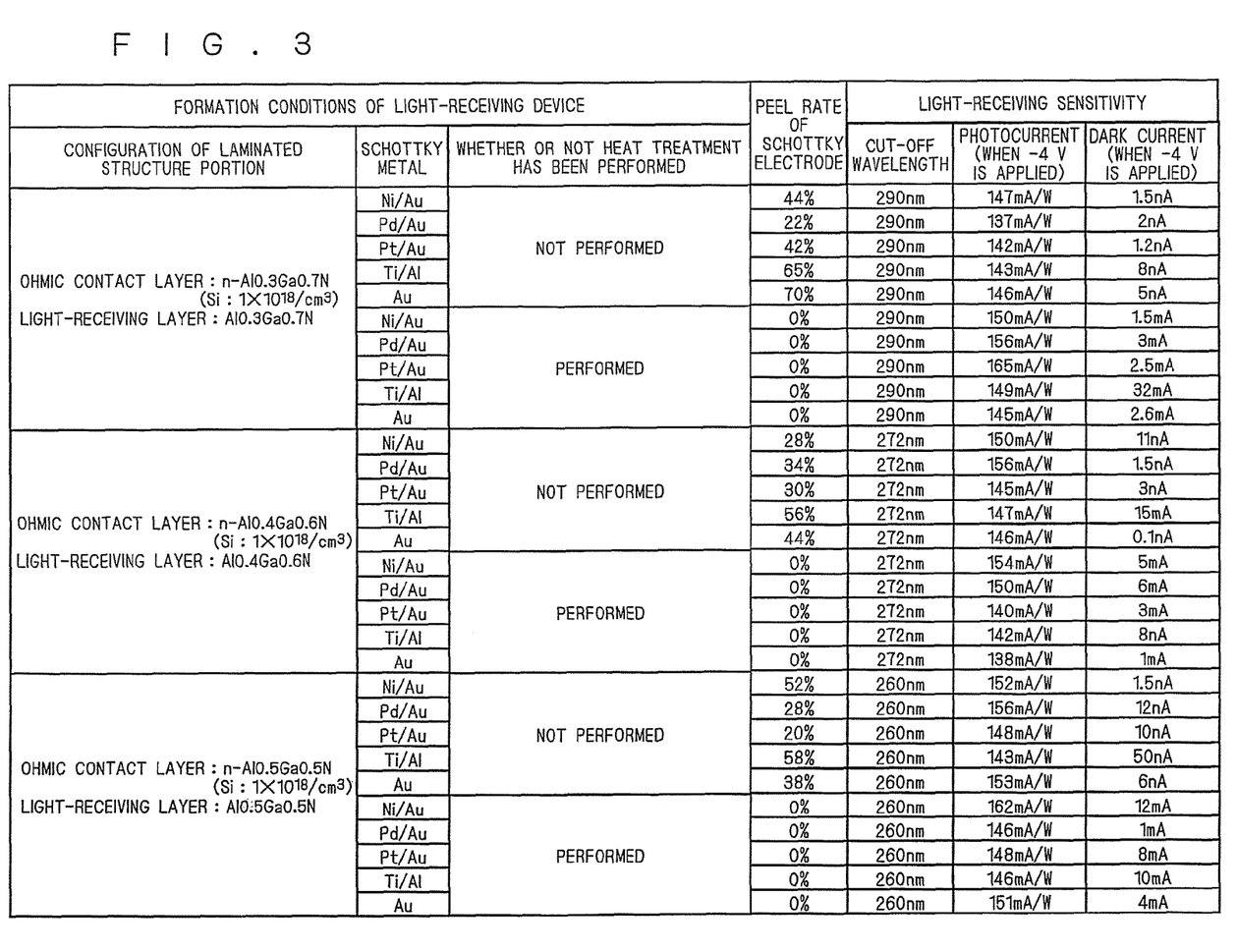
FIG. 3 is a table showing formation conditions and measurement results of light-receiving sensitivity of a light-receiving device according to Comparative Example.

FIG. 3 is a table showing the formation conditions and measurement results of light-receiving sensitivity of the light-receiving device according to Comparative Example.

In Comparative Example, twenty-four types of light-receiving devices were manufactured on the same manufacturing conditions of the light-receiving device of Example except for that the Schottky contact layer 4 was not provided and the Schottky electrode 5 was formed directly on the top surface of the light-receiving layer 3.

As in the case of Inventive Example, the peel rate, dark current, photocurrent and cut-off wavelength of the obtained light-receiving devices were obtained.

Comparison between Inventive Example and Comparative Example

It was confirmed from the results shown in FIG. 2 and FIG. 3 that, in both Inventive Example and Comparative Example, the cut-off wavelength is 290 nm in a case where an Al ratio between the Ohmic contact layer 2 and the light-receiving layer 3 is the smallest, and there is a tendency that the Al-richer the composition of the Ohmic contact layer 2 and the light-receiving layer 3 is, the shorter-wavelength side the cut-off wavelength is shifted to. That is, the light-receiving devices having a detection wavelength range in an ultraviolet region were obtained.

Though there are some differences depending on types of the formation material for the Schottky electrode, in the light-receiving devices which have not been subjected to heat treatment after the formation of the Schottky electrode, the Schottky electrode has peeled off at relatively high ratio (peel rate is approximately 20 to 30% at minimum and exceeds 70% at maximum) both in Inventive Example and Comparative Example. In contrast, in the light-receiving devices which have been subjected to heat treatment, peeling was not observed at all even in the case of using any electrode formation material.

However, in Comparative Example, the dark current which is in nA order in the case where the heat treatment is not performed is considerably increased to be in mA order when the heat treatment has been performed. On the other hand, there are few differences in photocurrent irrespective of whether or not the heat treatment has been performed.

That is, in the case of the light-receiving device according to Comparative Example, it was observed that the heat treatment performed after the formation of the Schottky electrode produces an effect of preventing the Schottky electrode from peeling off, but considerably increases the dark current, leading to degradation in light-receiving sensitivity.

In contrast, irrespective of types of formation material for Schottky electrode, the dark currents of the light-receiving devices which have not been subjected to heat treatment are much smaller in Inventive Example compared with Comparative Example, such as pA order. In addition, there are few differences in value of the light-receiving devices which have been subjected to heat treatment except for the case where the Schottky metal is a Ti/Al multi-layer film. Note that the value of the dark current per se is maintained to be in pA order even in the case where the Schottky metal is a Ti/Al multi-layer film. Further, in Inventive Example, there can be obtained values of the photocurrent which are approximately 1.8 times to 2 times larger than those of Comparative Example irrespective of whether or not the heat treatment has been performed.

The results described above indicate that compared with the light-receiving device in which the Schottky electrode is directly brought into Schottky junction with the light-receiving layer, when the Schottky contact layer is provided on the light-receiving layer, and the Schottky electrode is brought into Schottky junction with the Schottky contact layer to form MIS junction as in the case of the light-receiving device according to Inventive Example, it is possible to realize the light-receiving device in which the dark current is remarkably suppressed and the photocurrent is increased. It is also indicated that it is possible to prevent the Schottky electrode from peeling off almost without fail by performing heat treatment after the formation of the Schottky electrode.

Further, the results described above confirm that the Ti/Al multi-layer film which is generally used as Ohmic junction metal for a group III nitride material can be used as Schottky junction metal in the case where the Schottky contact layer is formed of AlN.

Diffusion of Schottky Metal Material

Figure 4:
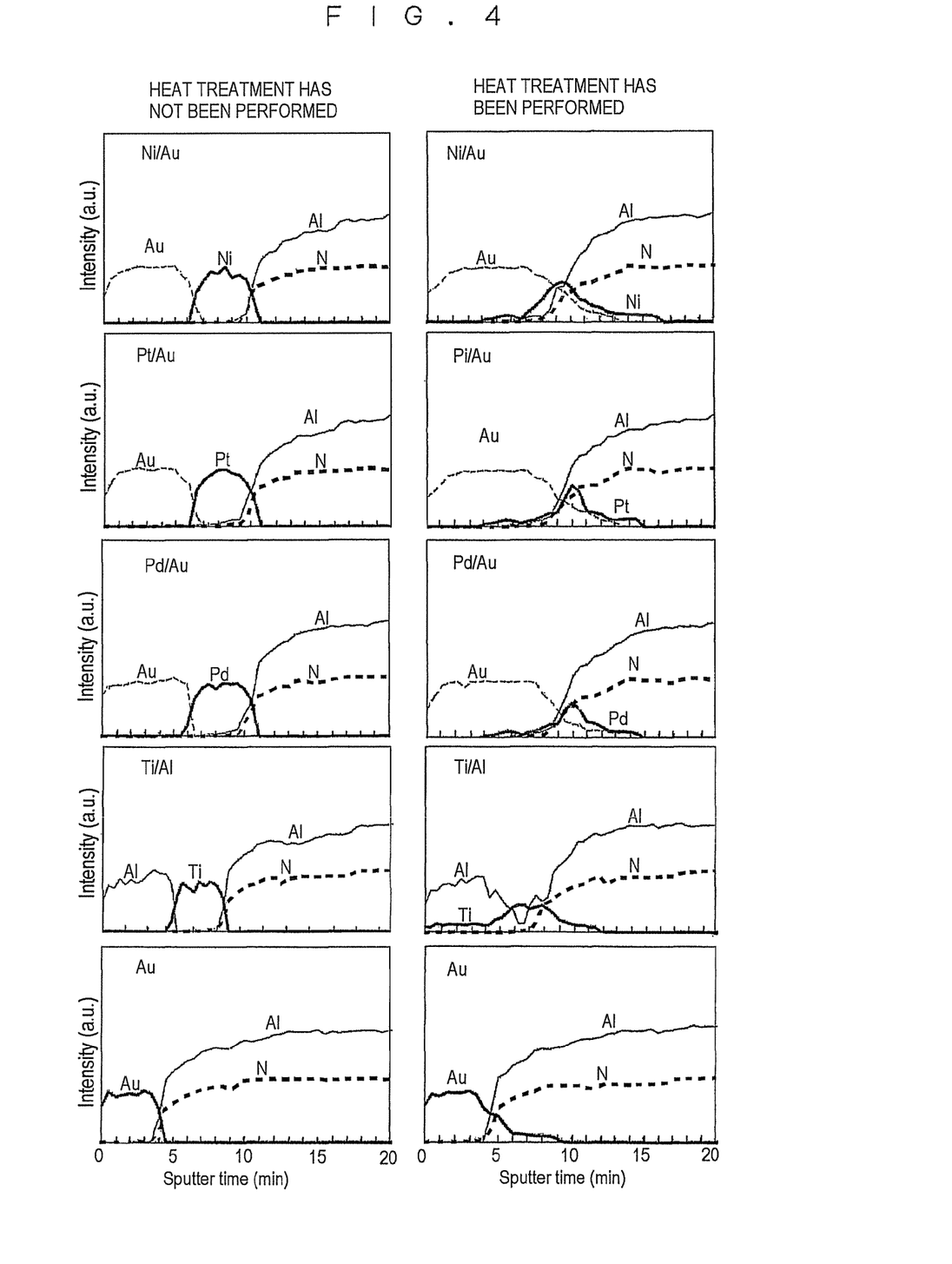
FIG. 4 are graphs showing depth profiles of main elements of the light-receiving device according to Example before and after heat treatment.

Among the light-receiving devices according to Example, for five light-receiving devices in which the composition of the Ohmic contact layer 2 and that of the light-receiving layer 3 are each $Al_{0.3}Ga_{0.7}N$ (however, the Ohmic contact layer 2 contains Si as a donor impurity at a concentration of $1 \times 10^{18}/cm^3$) and only the formation material for the Schottky electrode 5 is different from each other, depth profiles of the main elements were measured using Auger electron spectroscopy. The measurement was executed for the light-receiving devices which have been subjected to heat treatment and the light-receiving devices which have not been subjected to heat treatment, respectively. FIG. 4 are graphs showing the depth profiles obtained by the measurement. The results shown in FIG. 4 clearly indicate that, by performing the heat treatment, the metal elements forming the Schottky electrode 5 diffuse in the vicinity of a surface of AlN and make a solid solution therewith to resultantly form the interface layer. The results indicate that the formation of the interface layer is contributory to preventing the Schottky electrode from peeling off due to heat treatment.

While the invention has been shown and described in detail, the foregoing description is in all aspects illustrative and not restrictive. It is therefore understood that numerous modifications and variations can be devised without departing from the scope of the invention.

What is claimed is:

1. A light-receiving device, comprising:
   a first contact layer formed of a first group III nitride and being a low-resistance layer having an n-type conductivity;
   a light-receiving layer formed of a second group III nitride, having an n-type conductivity, and being adjacent to said first contact layer;
   a second contact layer formed of AlN, having an insulating property, and being adjacent to said light-receiving layer;
   a first electrode brought into Ohmic junction with said first contact layer;
   a second electrode, consisting of at least one of Pt, Pd and Au and having optical transparency, brought into Schottky junction with said second contact layer,
   wherein the Schottky junction between said second electrode and said second contact layer is strengthened by heat treatment under a nitrogen gas atmosphere; and
   an interface layer is formed by said heat treatment between said second electrode and said second contact layer.

2. The light-receiving device according to claim 1, wherein said AlN has a bandgap larger than a bandgap of said second group III nitride.

3. The light-receiving device according to claim 2, wherein:
   said first group III nitride is $Al_xGa_{1-x}N$ ($0 \leq x \leq 1$); and
   said second group III nitride is $Al_yGa_{1-y}N$ ($0 \leq y < 1$).

4. The light-receiving device according to claim 3, wherein said second contact layer has a thickness of 1 nm or more and 10 nm or less.

5. The light-receiving device according to claim 1, wherein said interface layer contains constituent elements of said second contact layer and constituent elements of said second electrode.

6. The light-receiving device according to claim 1, wherein:
   said interface layer is formed as a solid solution in which at least one of Pt, Pd and Au is mixed in said AlN.

7. The light-receiving device according to claim 1, wherein said second electrode causes light to be received in said light-receiving layer to pass therethrough.

8. The light-receiving device according to claim 1, wherein said light-receiving layer and said second contact layer have been formed in a continuous manner at the same temperature.

9. A manufacturing method for a light-receiving device, comprising the steps of:
   (a) epitaxially growing a crystal layer formed of a first group III nitride on a predetermined substrate while doping a predetermined dopant to form a first contact layer, said first contact layer being a low-resistance layer having an n-type conductivity;
   (b) epitaxially growing a crystal layer formed of a second group III nitride on said first contact layer to form a light-receiving layer having an n-type conductivity;
   (c) epitaxially growing a crystal layer formed of AlN on said light-receiving layer to form a second contact layer having insulating property;
   (d) bringing a first electrode into Ohmic junction with said first contact layer;
   (e) bringing a second electrode consisting of at least one of Pt, Pd and Au and having optical transparency into Schottky junction with said second contact layer; and
   (f) performing, under a nitrogen gas atmosphere, heat treatment on a device body obtained by performing said steps (a) to (e),
   wherein an interface layer between said second electrode and said second contact layer is formed in said step (f).

10. The manufacturing method for a light-receiving device according to claim 9, wherein said AlN has a bandgap larger than a bandgap of said second group III nitride.

11. The manufacturing method for a light-receiving device according to claim 10, wherein:
    said first group III nitride is $Al_xGa_{1-x}N$ ($0 \leq x \leq 1$); and
    said second group III nitride is $Al_yGa_{1-y}N$ ($0 \leq y < 1$).

12. The manufacturing method for a light-receiving device according to claim 11, wherein said second contact layer is formed so as to have a thickness of 1 nm or more and 10 nm or less in said step (c).

13. The manufacturing method for a light-receiving device according to claim 9, wherein said interface layer contains constituent elements of said second contact layer and constituent elements of said second electrode.

14. The manufacturing method for a light-receiving device according to claim 9, wherein:
    said interface layer is formed as a solid solution in which at least one of Pt, Pd and Au is mixed in said AlN in said step (f).

15. The manufacturing method for a light-receiving device according to claim 9, wherein
    said light-receiving layer and said second contact layer are formed in a continuous manner at the same temperature.

* * * * *